US006810063B1

(12) United States Patent
Mukaihara et al.

(10) Patent No.: US 6,810,063 B1
(45) Date of Patent: Oct. 26, 2004

(54) SEMICONDUCTOR LASER DEVICE (75) Inventors: Toshikazu Mukaihara, Tokyo (JP); Takeharu Yamaguchi, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/513,702

(22) Filed: Feb. 25, 2000

(30) Foreign Application Priority Data

Jun. 9, 1999 (JP) .......................................... 11-162792

(51) Int. Cl.[7] ............................................... H01S 3/08
(52) U.S. Cl. ............................ 372/96; 372/45; 372/75; 372/72; 372/99
(58) Field of Search ............................. 372/45, 75, 92, 372/96, 99

(56) References Cited

U.S. PATENT DOCUMENTS

| | | | | |
|---|---|---|---|---|
| 4,616,898 A | | 10/1986 | Hicks, Jr. ................ | 350/96.15 |
| 4,651,322 A | * | 3/1987 | Shimizu et al. ............... | 372/45 |
| 4,731,792 A | * | 3/1988 | Shimizu et al. ............... | 372/49 |
| 5,189,679 A | | 2/1993 | Derry Jr. ..................... | 372/45 |
| 5,305,336 A | | 4/1994 | Adar et al. ................... | 372/18 |
| 5,377,291 A | * | 12/1994 | Hatakoshi et al. .......... | 385/122 |
| 5,563,732 A | | 10/1996 | Erdogan et al. ............ | 359/341 |
| 5,572,616 A | * | 11/1996 | Aoki et al. .................. | 385/131 |
| 5,699,377 A | | 12/1997 | Pan ............................ | 372/92 |
| 5,721,636 A | | 2/1998 | Erdogan et al. ............ | 359/341 |
| 5,724,377 A | | 3/1998 | Huang ......................... | 372/22 |
| 5,737,474 A | | 4/1998 | Aoki et al. .................. | 385/131 |
| 5,801,403 A | | 9/1998 | He | |
| 5,845,030 A | | 12/1998 | Sasaki et al. ................. | 385/88 |
| 5,870,417 A | * | 2/1999 | Verdiell et al. ............... | 372/32 |
| 5,936,763 A | | 8/1999 | Mitsuda et al. ............. | 359/341 |
| 5,960,019 A | * | 9/1999 | Hayashi et al. .............. | 372/46 |

(List continued on next page.)

FOREIGN PATENT DOCUMENTS

| | | | | |
|---|---|---|---|---|
| EP | 800243 A2 | 10/1997 | .......... | H01S/3/025 |
| EP | 0812040 A | 12/1997 | .......... | H01S/3/085 |
| JP | 62-276892 A | 12/1987 | ............ | H01S/3/18 |

(List continued on next page.)

OTHER PUBLICATIONS

Kashukawa, et al., "High Power Semiconductor Lasers for Optical Fiber Amplifiers," Technical report of the Institute of Electronics, Information and Communication Engineers (IEICE), Vol. 96, No. 188, Jul. 1996, pp. 23–30. (In Japanese, English–Language Abstract).

Prosyk, et al., "Well Number, Length, and Temperature Dependence of Efficiency and Loss in InGaAsP–InP Compressively Strained MQW Ridge Waveguide Lasers of 1.3 $\mu$m," IEEE Journal of Quantum Electronics, Vol. 33, No. 8, Aug. 1997.

Hamakawa, et al., "Wavelength Stabilization of 1.48 $\mu$m Pump Laser by Fiber Grating," 22-nd European Conference on Optical Communication—ECOC '96, Oslo, 1996, Vol. 1, pp. 119–122.

(List continued on next page.)

*Primary Examiner*—David Vu
*Assistant Examiner*—Delma R. Flores Ruiz
(74) *Attorney, Agent, or Firm*—Sheppard Mullin Richter & Hampton LLP (57) ABSTRACT

A semiconductor laser device according to the present invention comprises a laminated structure of a semiconductor material including an active layer formed of a quantum well structure, a low-reflection film formed on one end face of the structure, and a high-reflection film formed on the other end face of the structure. The cavity length (L) of the device is 1,200 $\mu$m or more. This laser device, which enjoys high kink currents and a satisfactorily linear current-optical output characteristic, is a useful pumping light source for optical fiber amplifier.

30 Claims, 6 Drawing Sheets

U.S. PATENT DOCUMENTS

| | | | | |
|---|---|---|---|---|
| 5,978,401 A | * | 11/1999 | Morgan | 372/50 |
| 5,995,525 A | | 11/1999 | Kosugi | 372/36 |
| 5,995,692 A | | 11/1999 | Hamakawa et al. | 385/49 |
| 6,122,299 A | * | 9/2000 | DeMars et al. | 372/103 |
| 6,323,052 B1 | * | 11/2001 | Horie et al. | 438/46 |
| 6,396,861 B1 | * | 5/2002 | Shimizu et al. | 372/45 |
| 6,567,447 B1 | * | 5/2003 | Yoshida et al. | 372/49 |
| 6,738,403 B2 | * | 5/2004 | Kuniyasu et al. | 372/43 |
| 2001/0048702 A1 | * | 12/2001 | Yoshida et al. | 372/43 |
| 2003/0026308 A1 | * | 2/2003 | Iwai et al. | 372/46 |

FOREIGN PATENT DOCUMENTS

| | | | | |
|---|---|---|---|---|
| JP | 03-049281 A | 3/1991 | | H01S/3/18 |
| JP | 04-343492 A | 11/1992 | | H01S/3/18 |
| JP | 05-136511 A | 6/1993 | | H01S/3/131 |
| JP | 05-206579 A | 8/1993 | | H01S/3/18 |
| JP | 05-206580 A | 8/1993 | | H01S/3/18 |
| JP | 5-315705 A | 11/1993 | | H01S/3/18 |
| JP | 05-327031 A | 12/1993 | | H01L/35/28 |
| JP | 7-99373 A | 4/1995 | | |
| JP | 07-333470 A | 12/1995 | | G02B/6/42 |
| JP | 8-201609 A | 8/1996 | | G02B/5/18 |
| JP | 08-330671 A | 12/1996 | | H01S/3/18 |
| JP | 9-83059 A | 3/1997 | | |
| JP | 9-83070 A | 3/1997 | | |
| JP | 09-219475 A | 8/1997 | | H01L/23/38 |
| JP | 9-260766 A | 10/1997 | | |
| JP | 09-269439 A | 10/1997 | | G02B/6/42 |
| JP | 09-275240 A | 10/1997 | | H01S/3/18 |
| JP | 9-283847 A | 10/1997 | | H10S/3/18 |
| JP | 09-298319 A | 11/1997 | | H01L/35/30 |
| JP | 10-062654 A | 3/1998 | | G02B/6/42 |
| JP | 10-154847 A | 6/1998 | | |
| JP | 11-017248 A | 1/1999 | | H01S/3/085 |

OTHER PUBLICATIONS

English Translation of JP–05–206579–A, previously provided as Citation B6.

Full English translation of: M. Shigehara, et al., "Single Longitudinal Mode Laser Diode using Fiber Bragg Grating," Proceedings of the 1995 of IEICE General Conference (The Institute of Electronics, Information and Communications Engineers), Mar. 27, 1995, pp. 380, previously provided as Citation C8.

T. Kamijoh, et al., "Improved Operation Characteristics of Long–Wavelength Lasers Using Strained MQW Active Layers," IEEE Journal of Quantum Electronics, Vol. 30, No. 2, pp. 524–532, Feb. 1994, IEEE, New York.

T. R. Chen, et al., "Cavity Length dependence of the Wavelength of Strained–Layer InGaAs/GaAs Lasers," Applied Physics Letters, Vol. 57, No. 23, pp. 2402–2403, Dec. 3, 1990, American Institute of Physics, New York.

Kasukawa, et al., "High Power Semiconductor Lasers for Optical Fiber Amplifiers," Technical report of the Institute of Electronics, Information and Communication Engineers (IEICE), Vol. 96, No. 188, Jul. 1996, pp. 23–30. (In Japanese, English–Language Abstract).

Prosyk, et al., "Well Number, Length, and Temperature Dependence of Efficiency and Loss in InGaAsP–InP Compressively Strained MQW Ridge Waveguide Lasers at 1.3 $\mu$m," IEEE Journal of Quantum Electronics, Vol. 33, No. 8, Aug. 1997.

Hamakawa, et al., "Wavelength Stabilization of 1.48 $\mu$m Pump Laser by Fiber Grating," 22–nd European Conference on Optical Communication—ECOC '96, Oslo, 1996, Vol. 1, pp. 119–122.

English Translation of JP–05–206579–A, previously provided as Citation B6.

Full English translation of: M. Shigehara, et al., "Single Longitudinal Mode Laser Diode using Fiber Bragg Grating," Proceedings of the 1995 of the IEICE General Conference (The Institute of Electronics, Information and Communications Engineers), Mar. 27, 1995, p. 380, previously provided as Citation C8.

G. P. Agrawal, "Longitudinal–Mode Stabilization in Semiconductor Lasers with Wavelength–Selective Feedback," Journal of Applied Physics, Vol. 59, No. 12, Jun. 15, 1986, pp. 3958–3961.

S. Oshiba, et al., "High–Power Output Over 200 mW of 1.3 $\mu$m GainAsP VIPS Lasers," IEEE Journal of Quantum Electronics, Vol. QE–23, No. 6, Jun. 1987, pp. 738–743.

Toshio Nonaka, "Pumping sources for Optical Fiber Amplifiers," Optronics, (published by The Optronics Co., Ltd.), No. 107, Nov. 1990. (In Japanese, English–Language Abstract on last page).

Asano, et al., "1.48 $\mu$m High–Power InGaAs/InGaAsP MQW LD's for Er–Doped Fiber Amplifiers," IEEE Photonics Technology Letters, Vol. 3, No. 5, May 1991, pp. 415–417.

Ikuo Mito and Kenji Endo, "1.48 $\mu$m and 0.98 $\mu$m High––Power Laser diodes for Erbium–doped Fiber Amplifiers," Optical amplifiers and their applications, summaries of papers presented at the Optical Amplifiers and Their Applications Topical Meeting, Jul. 24–26, 1991, Snowmass Village, Colorado, cosponsored by IEEE/Lasers and Electro–optics Society and the Optical Society of America, Technical digest series. 1991, v. 13, pp. 22–25.

T. Higashi, et al., "Optimum Asymmetric Mirror Facets Structure for High Efficiency Semiconductor Lasers," 13th IEEE International Semiconductor Laser Conference, Sep. 1992, Takamatsu Japan, pp. 46–47.

C. R. Giles, et al., "Simultaneous Wavelength–Stabilization of 980–nm Pump Lasers," Optical amplifiers and their applications, summaries of papers presented at the Optical Amplifiers and Their Applications Topical Meeting, Jun. 4–6, 1993, Yokohama, Japan, cosponsored by Optical Society of America and the IEEE Lasers and Electro–optics Society, pp. 380–383.

M. Shigehara, et al., "Single Longitudinal Mode Laser Diode using Fiber Bragg Grating," Proceedings of the 1995 of the IEICE General Conference (The Institute of Electronics, Information and Communications Engineers), Mar. 27, 1995, p. 380 (In Japanese, Partial English–language translation attached).

T. Wakami, et al., "0.98 $\mu$m Laser Diode with Fiber Bragg Gratings," Proceedings of the 1995 Electronics Society Conference of IEICE (The Institute of Electronics, Information and Communications Engineers), Sep. 5, 1995, pp. 156 (In Japanese, Partial English–language translation attached).

R. J. Campbell, et al., "A Wavelength Stable Uncooled Laser for Access Networks," Proceedings of the 21st European Conference on Optical Communications (ECOC'95), Brussels, Belgium, Sep. 17–21, 1995, pp. 545–548.

Don Hargreaves, et al., "High–power 980–nm Pump Module Operating Without a Thermoelectric Cooler," 1996 Technical Digest Series (Conference Edition) of the Optical Fiber Communication 1996 ("OFC '96"), Optical Society of America, Feb. 25, 1996 (San Jose Calif.), pp. 229–230.

J. Piprek, et al., "Cavity Length Effects on Internal Loss and Quantum Efficiency of Multiquantum–Well Lasers," IEEE Journal of Selected Topics in Quantum Electronics, Vol. 5, No. 3, May/Jun. 1999, pp. 643–647 (UCSB).

Akihiko Kasukawa, Tomokazu Mukaihara, Takeharu Yamaguchi, Jun'jiro Kikawa, "Recent Progress of High Power Semiconductor Lasers for EDFA Pumping," Furukawa Review, No. 19, Apr. 2000, pp. 23–28.

Akihiko Kasukawa, Tomokazu Mukaihara, Takeharu Yamaguchi, Jun'jiro Kikawa, "Recent Progress in High–Power Semiconductor Lasers for Pumping of Optical Fiber Amplifiers," Furukawa Electric Review, No. 105, Jan. 2000, pp. 13–18. (In Japanese).

Toshio Kimura, Naoki Tsukiji, Junji Yoshida, Naoki Kimura, Takeshi Aikiyo, Tetsuro Ijichi, and Yoshikazu Ikegami, "1480–nm Laser Diode Module with 250–mW Output for Optical Amplifiers (Fol 1404QQ Series)," Furukawa Review, No. 19, Apr. 2000, pp. 29–33.

Toshio Kimura, Naoki Tsukiji, Junji Yoshida, Naoki Kimura, Takeshi Aikiyo, Tetsuro Ijichi, and Yoshikazu Ikegami, "250 mW—1480 nm Laser Diode Module for Optical Amplifiers (Fol 1404QQ Series)," Furukawa Electric Review, No. 105, Jan. 2000, pp. 19–23. (In Japanese).

Akira Mugino and Yuichiro Irie, "Output Power Optimization in 980–nm Pumping Lasers Wavelength–Locked Using Fiber Bragg Gratings," Furukawa Review, No. 19, Apr. 2000, pp. 41–46.

Akira Mugino and Yuichiro Irie, "Output Power Optimization of 980–nm Pumping Lasers Wavelength–Locked Using Fiber Bragg Gratings," Furukawa Electric Review, No. 105, Jan. 2000, pp. 24–29. (In Japanese).

Yoshihiro Emori and Shu Namiki, "Demonstration of Broadband Raman Amplifiers: a Promising Application of High–power Pumping Unit," Furukawa Review, No. 19, Apr. 2000, pp. 59–62.

Yoshihiro Emori and Shu Namiki, "Demonstration of Broadband Raman Amplifiers as a Promising Application of High–power Pumping Unit," Furukawa Electric Review, No. 105, Jan. 2000, pp. 42–45. (In Japanese).

Osamu Aso, Masateru Taadakuma, Shu Namiki, "Four–Wave Mixing in Optical Fibers and its Applications," Furukawa Review, No. 19, Apr. 2000, pp. 63–68.

Osamu Aso, Masateru Taadakuma, Shu Namiki, "Four–Wave Mixing in Optical Fibers and its Applications," Furukawa Electric Review, No. 105, Jan. 2000, pp. 46–51. (In Japanese).

Hitoshi Shimizu, Kouji Kumada, Nobumitsu Yamanaka, Norihiro Iwai, Tomokazu Mukaihara, and Akihiko Kasukawa, "Extremely Low threshold 1.3 $\mu$m InAsP n–Type Modulation Doped MQW Lasers," Furukawa Review, No. 19, Apr. 2000, pp. 149–154.

Hitoshi Shimizu, Kouji Kumada, Nobumitsu Yamanaka, Norihiro Iwai, Tomokazu Mukaihara, and Akihiko Kasukawa, "Extremely Low threshold 1.3 $\mu$m InAsP n–Type Modulation Doped MQW Lasers," Furukawa Electric Review, No. 104, Jul. 1999, pp. 48–52. (In Japanese).

Translation of Japanese Published Patent Application JP–09–83070, which was provided in Applicants' previous information Disclosure Statement.

Translation of Japanese Published Patent Application JP–09–260766, which was provided in Applicants' previous information Disclosure Statement.

A. Kasukawa et al., "Extremely High Power 1.48 $\mu$m GaInAsP/InP GRIN–SCH Strained MQW Lasers", *IEEE PHOTONICS TECHNOLOGY LETTERS*, Vol. 6, No. 1 pp. 4–6 (Jan. 1994).

P. Gavrilovic et al., CW High Power Single–Lobed Far–Field Operation of Long–Cavity AIGaAs–GaAs Single–Quantum–Well Laser Diodes Grown by MOCVD, *Journal of Quantum Electronics*, Vol. 27, No. 7, pp. 1859–1862 (Jul. 1991).

\* cited by examiner

HORIZONTAL POSITION OF
LUMINOUS SURFACE

FIG. 6

CAVITY LENGTH (L: μm)

SEMICONDUCTOR LASER DEVICE

BACKGROUND OF THE INVENTION

1. Field of the Invention

The present invention relates to a semiconductor laser device, and more specifically, to a semiconductor laser device adapted for use as a pumping light source for optical fiber amplifier, such as a laser device of the gain-waveguide type that oscillates with a wavelength of, e.g., 0.98 μm and requires high optical output of hundreds of mW, and capable of ensuring a linear current-optical output characteristic even during high-current operation.

2. Prior Art

In a semiconductor laser device that has an active layer (quantum region) formed of a quantum well structure, injected carriers are quantized toward quantum wells, and the state density of carrier energy is stepped. Accordingly, the gain coefficient suddenly rises in response to driving current, so that a laser beam can be oscillated even with use of a low threshold current density. The semiconductor laser device of this type delivers higher optical output than a semiconductor laser device that includes an active layer of a bulk semiconductor, so that it is being studied for practical use as a pumping light source for optical fiber amplifier.

Figure 1:
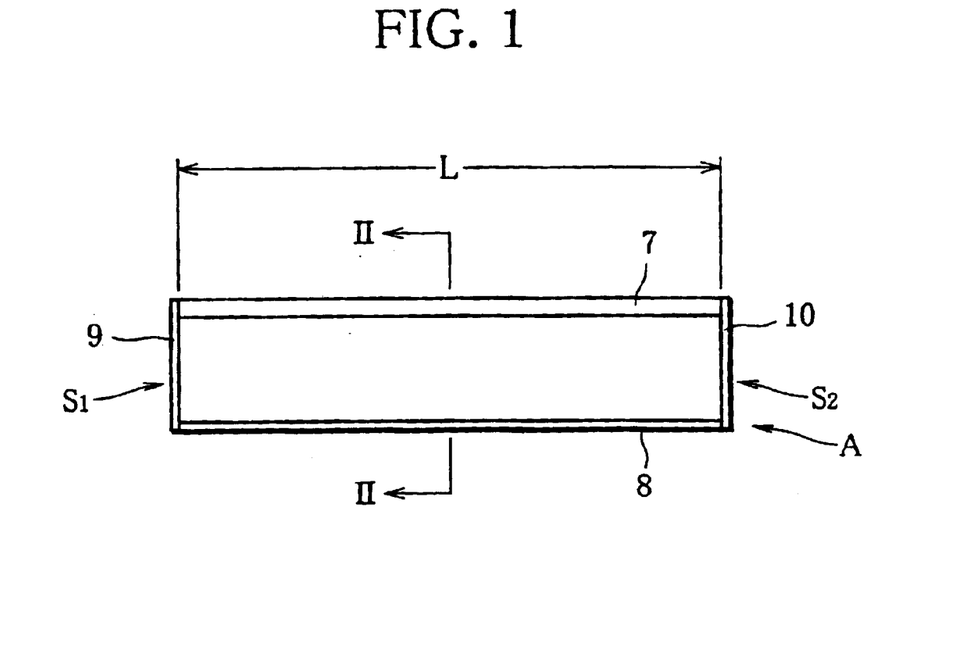
FIG. 1 is a side view of a laser device A of the gain-waveguide type.
Figure 2:
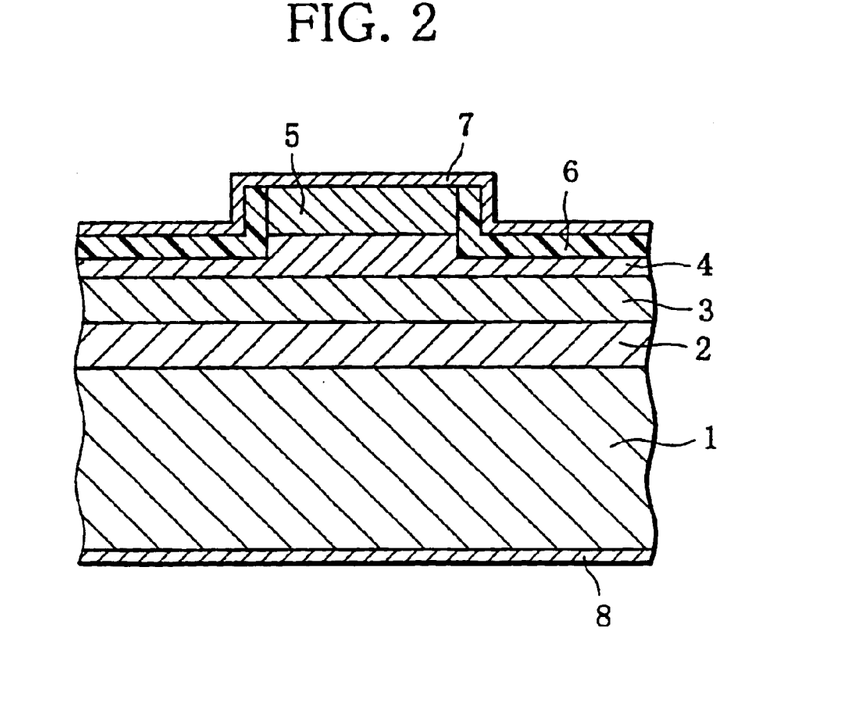
FIG. 2 is a sectional view taken along line II—II of FIG. 1.

The following semiconductor laser device that oscillates with a wavelength of 0.98 μm was an object of investigation by the inventors as a pumping light source for optical fiber amplifier. This device will now be described with reference to the accompanying drawings. FIG. 1 is a side view showing the semiconductor laser device, and FIG. 2 is a sectional view taken along line II—II of FIG. 1.

The device has a layer structure of a semiconductor material, including a lower clad layer 2 of n-AlGaAs, an active layer 3 of a quantum-well structure made of InGaAs and GaAs, an upper clad layer 4 of p-AlGaAs, and a cap layer 5 of p-GaAs, which are stacked in layers on an n-GaAs substrate 1. A part of the upper clad layer 4 and the cap layer 5 form a mesa structure, and a passivation film 6 of SiN is formed on the lateral of the mesa structure. Further, an upper electrode 7 of Ti/Pt/Au is formed on the cap layer 5 and the passivation film 6, and a lower electrode 8 of AuGe/Ni/Au is formed on the back surface of the substrate 1.

The device A is manufactured in the following manner. The aforesaid layer structure is formed on the n-GaAs substrate by, for example, the MOCVD method, and the upper and lower electrodes are formed on the upper and lower surfaces, respectively, of the layer structure. Thereafter, the resulting structure is cleft with a given cavity length L, a low-reflection film 9 of, e.g., SiN is formed on one end face (front facet) $S_1$ of the structure, and a high-reflection film 10 of, e.g., $SiO_2/Si$ is formed on the other end face (rear facet) $S_2$.

In the case of the device A having this mesa structure, it is believed that high optical output can be effectively obtained by increasing the cavity length L. This is because if the cavity length L increases, the influence of heat can be lessened, so that high-optical output can be expected. If the cavity length is too long, however, the differential quantum efficiency of the device A lowers, so that higher current is required for high-optical output operation. Normally, therefore, the cavity length L of the device A with this construction is designed so that the cavity length L is not longer than 1,000 μm.

The inventors hereof examined the current-optical output characteristic for the case where the cavity length L of the device A with the layer structure shown in FIGS. 1 and 2 was adjusted to 800 μm. Thereupon, the characteristic curve of FIG. 3 and the following new knowledge were obtained.

Figure 3:
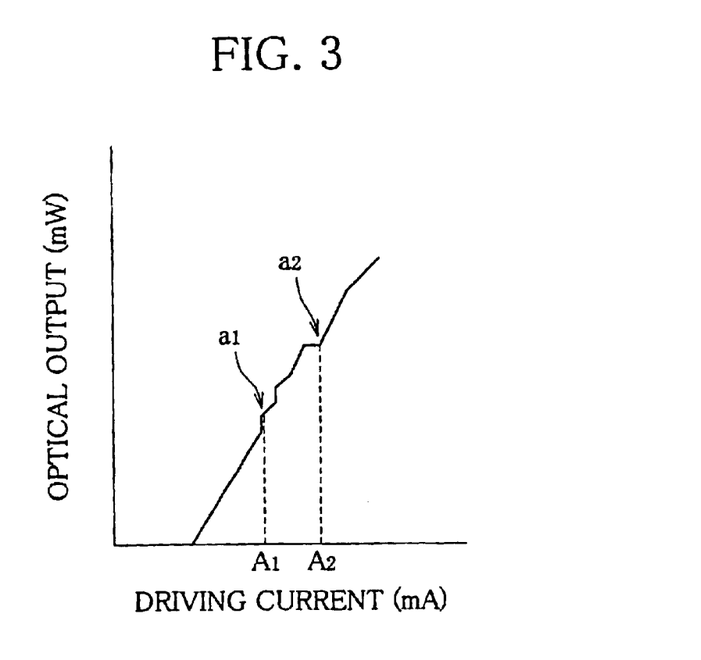
FIG. 3 shows a current-optical output characteristic curve for the device A of FIG. 1 (for the case of the cavity length of 800 μm)

When a driving current ($A_1$) of about 200 mA was injected, as seen from FIG. 3, a first kink ($a_1$) was generated in the optical output, and the existing linear relation between the driving current and the optical output disappeared. If the driving current was further increased to a level ($A_2$) of about 500 mA, a second kink ($a_2$) was generated in the optical output. Thus, in the case of the device A, the two kinks $a_1$ and $a_2$ were generated in the current-optical output characteristic curve as the driving current was increased.

Accordingly, the inventors hereof first closely examined the oscillation spectrum of the device A. The following is a description of the results of the examination.

Figure 4:
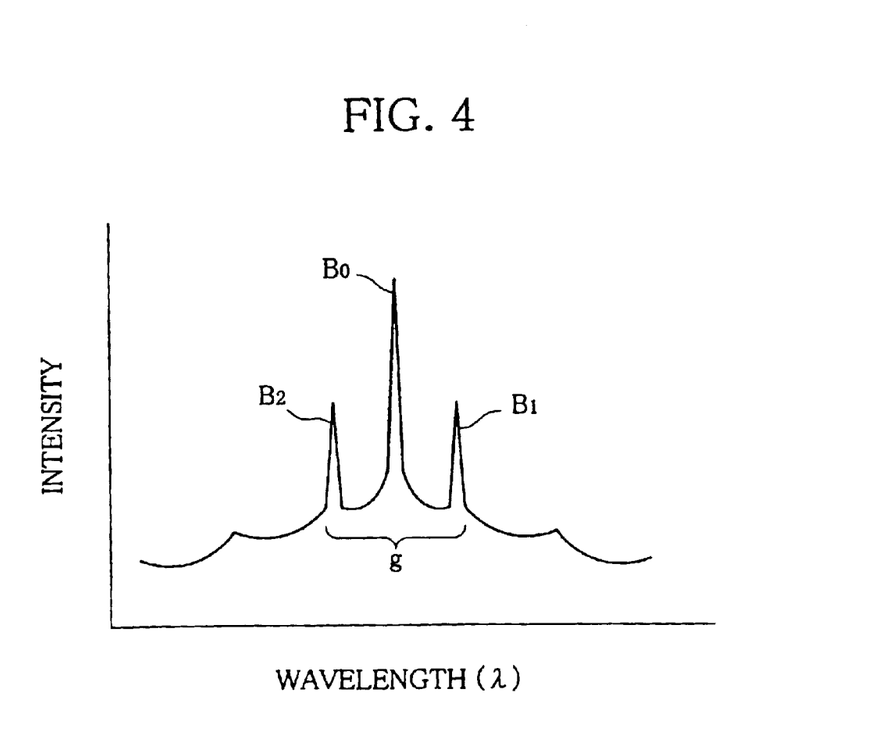
FIG. 4 shows an oscillation spectrum of the device of FIG. 1.

(1) FIG. 4 shows an oscillation spectrum obtained when the injected current was at about 200 mA.

As seen from this oscillation spectrum, there is a small number of longitudinal modes which oscillate actually in a gain band g. The intensity of a central longitudinal oscillation mode $B_0$ is 5 dB or more higher than those of side modes $B_1$ and $B_2$. As a whole, single longitudinal mode oscillation that is prescribed by the central longitudinal oscillation mode $B_0$ is dominant.

(2) An oscillation spectrum obtained when the first kink ($a_1$) was generated indicates that the central longitudinal oscillation mode $B_0$ jumps to the side mode $B_1$ at a distance of about 0.4 nm therefrom when the gain band shifts to the longer wavelength side as the temperature of the device rises with the increase of the injected current.

The probability of generation of single longitudinal mode oscillation is related to a spontaneous emission factor (βsp) given by $$\beta sp = \Gamma \cdot \lambda^4 \cdot K / 4\pi^2 \cdot n^3 \cdot V \cdot \delta\lambda, \tag{1}$$

where Γ is the confinement coefficient of the active layer, λ is an oscillation wavelength, K is a factor reflective of the complexity of the electric field for a transverse mode, n is an equivalent refractive index, V is the volume of the active layer, and δλ is the half width of the spontaneous emission spectrum. It is believed that the smaller the value βsp, the higher the probability of generation of single longitudinal mode oscillation is.

In the case of the device A, therefore, the oscillation wavelength (λ) is as short as 0.98 μm, so that βsp is lowered in proportion to the fourth power of λ. Accordingly, the device A can be supposed to be able to cause single longitudinal mode oscillation with high probability.

The following problem will be aroused, however, if a module is constructed in a manner such that the device A that undergoes single longitudinal mode oscillation is connected to an optical fiber. A laser beam generated by single longitudinal mode oscillation has its noise properties lowered under the influence of return light from an end portion of the optical fiber. Further, the oscillation of the laser beam is made unstable by the return light. Accordingly, an optical output fetched from the module and monitor current are rendered unstable.

In order to use the device A as a reliable pumping light source for optical fiber amplifier, therefore, it is necessary to solve the above problem that is attributable to single longitudinal mode oscillation.

The result (2) implies the following situation. In consideration of gain differences caused between the longitudinal modes for single longitudinal mode oscillation for the aforesaid reason, the longitudinal mode hopping occur which causes substantial discontinuous fluctuations of the optical output when the gain band shifts to the longer wavelength side in response to temperature rise. When the injected current almost reaches the level $A_1$, therefore, the current-optical output characteristic loses its linearity, so that the first kink ($a_1$) is generated.

Figure 5:
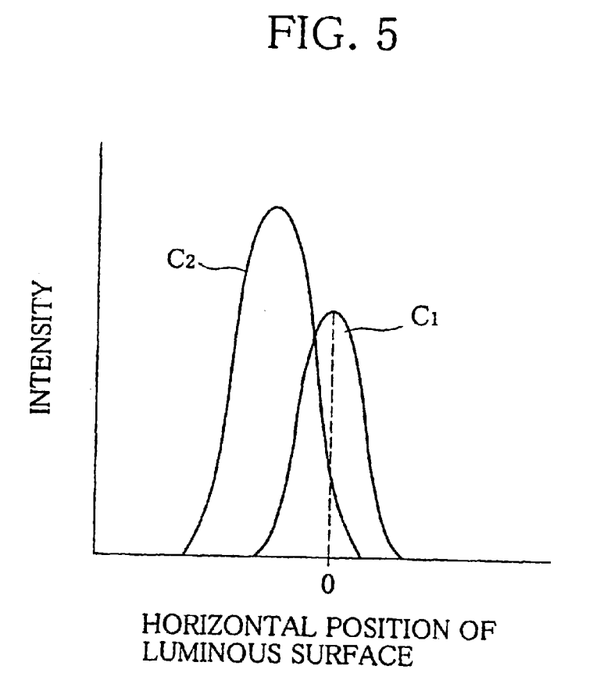
FIG. 5 is a graph showing transverse modes for a far field pattern of the device of FIG. 1.

Then, the inventors hereof observed a far field pattern of the device A and obtained the findings shown in FIG. 5.

In FIG. 5, curve $C_1$ represents a transverse oscillation mode for the case where the injected current is lower than $A_2$, and curve $C_2$ represents a transverse oscillation mode for the case where the injected current is near $A_2$ (or where the second kink $a_2$ is generated).

If the injected current increases to $A_2$, as seen from FIG. 5, unit-modal transverse oscillation modes shift horizontally from the center position of the device A (or undergo beam steering). Thus, the direction of emission of the laser beam changes.

In the case where the module is constructed by connecting the optical fiber to the device A, therefore, the optical output fetched through the optical fiber fluctuates when the injected current reaches a value approximate to $A_2$. This is supposed to result in the generation of the second kink ($a_2$) in the current-optical output characteristic curve.

From these investigations, the inventors discovered that the linearity of the current-optical output characteristic curve can be secured by adjusting the cavity length (L) to a value not smaller than 1200 μm. Preferably, the device has a transverse light confinement structure with the transverse refractive index difference of about $1\times10^{-2}$ for oscillation modes, the reflectance of the low-reflection film on the one end face is 5% or less, and the active layer is formed of one or two quantum well structures.

OBJECT AND SUMMARY OF THE INVENTION

An object of the present invention is to provide a semiconductor laser device of the gain-waveguide type, capable of oscillating in a longitudinal multi-mode without generating any kinks in a current-optical output characteristic curve even with use of an injected current of 500 mA or more.

Another object of the invention is to provide a novel semiconductor laser device adapted for use as a high-reliability pumping light source for optical fiber amplifier and connected to an optical fiber to form a module, in which a bad influence of return light can be restrained and there is no possibility of beam steering in a far field pattern, so that fluctuations of fetched optical output can be inhibited.

The inventors hereof conducted the following examinations in the process of investigation to achieve the above objects. These examinations will be described first.

(1) First, single longitudinal mode oscillation occurs with high probability in the case of a semiconductor laser device that oscillates in a short-wavelength band of about 0.98 μm. If the injected current increases, the longitudinal mode hopping occurs which causes substantial fluctuations of the optical output. This results in the development of a first kink ($a_1$) in a current-optical output characteristic curve.

It is known that the intervals between the longitudinal modes are proportional to the reciprocal of the cavity length (L) of the device. Therefore, the intervals between the longitudinal modes can be shortened by increasing the cavity length (L) of the device, so that fluctuations of the optical output caused by the jumping of the longitudinal modes can be reduced, supposedly.

(2) Further, a shift of transverse oscillation modes (beam steering) that causes a second kink ($a_2$) is a phenomenon that takes place from the following cause. As the injected current increases, rise of the temperature is accelerated by resistance heating. The refractive index of a region near the active layer is increased by the thermal lens effect, so that the distribution width of light in the horizontal direction is reduced. Accordingly, the carrier density of a light distribution area is lowered by spatial hole burning of carriers, so that the refractive index increases further. In the end, the refractive index distribution in the horizontal direction is disturbed, so that the transverse light confinement effect is lowered.

In order to prevent the generation of the second kink, therefore, it may be advisable to design the device (cavity) so that its resistance heat is small even when high current is injected. To attain this, it is necessary only that the cavity length of the device be increased to lower the resistance of the device.

(3) If the cavity length (L) of the device is increased, in this case, the quantum efficiency lowers inevitably. However, this can be avoided by using a low-reflection surface as the quantum surface of the device.

In consideration of these circumstances, the inventors hereof varied the cavity length (L) of the device A and examined the current-optical output characteristic of the device. Thereupon, the inventors found that the linearity of the current-optical output characteristic curve can be secured by adjusting the cavity length (L) to a value not smaller than the value mentioned later, and developed the semiconductor laser device according to the present invention.

Thus, according to the invention, there is provided a semiconductor laser device comprising: a laminated structure of a semiconductor material including an active layer formed of a quantum well structure; a low-reflection film formed on one end face of the structure; and a high-reflection film formed on the other end face of the structure; and the cavity length of the device being 1,200 μm or more.

Preferably, the device has a transverse light confinement structure with the transverse refractive index difference of about $1\times10^{-2}$ for oscillation modes, the reflectance of the low-reflection film on the one end face is 5% or less, and the active layer is formed of one or two quantum well structures.

DETAILED DESCRIPTION OF THE PREFERRED EMBODIMENTS

In the opinion of the inventors, one basic requirement for a pumping laser diode is that its optical output power increase in a substantially smooth manner at high optical output powers as the driving current to the laser diode is increased. However, when the above-described laser diodes are attempted for use in pumping laser applications, the inventors have often found that these laser diodes do not have smooth curves at the high power levels required by pumping applications. The lack of smoothness is evidenced by the presence of kinks in the graph of optical output power versus driving current for the laser diodes.

The most distinguishing feature of the device of the invention lies in the cavity length (L) of 1,200 µm or more.

If the cavity length (L) increases, the intervals between the longitudinal modes which oscillate in the gain band of the oscillation spectrum are shortened in proportion to the reciprocal of the cavity length, as mentioned before. If the cavity length (L) is 1,200 µm or more and if the quantum well structure is formed of InGaAs/GaAs, the interval between each two adjacent longitudinal oscillation modes is about 0.12 nm spacing. This oscillation spectrum shows a longitudinal multi-oscillation mode in which a large number of longitudinal oscillation modes aggregate densely at short intervals in the gain band.

Figure 10:
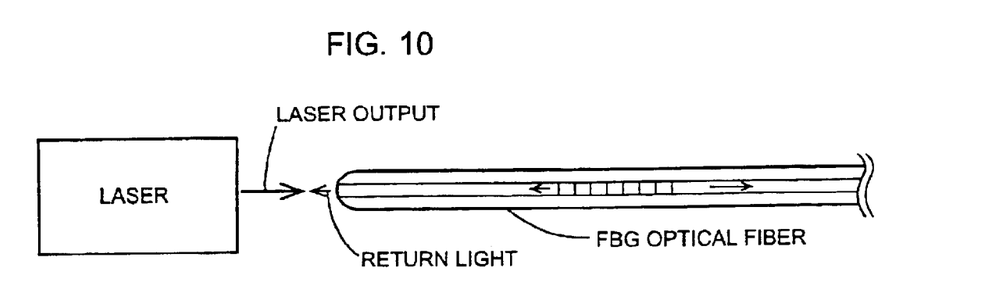
FIG. 10 is a schematic diagraph of a laser device A according to the present invention with its optical output coupled to a conventional optical fiber, showing return light to the laser device.

In the case of a module that is formed by connecting an optical fiber to the aforesaid device, therefore, return light from the optical fiber is also based on the longitudinal multi-mode, so that oscillation of a laser beam can be restrained from being made unstable by the return light. FIG. 10 is a schematic diagraph showing the coupling of output light from the laser device to a conventional optical fiber having a fiber Bragg grating, and showing the coupling of return light back to the laser device.

In this longitudinal multi-oscillation mode, moreover, gain differences between the longitudinal modes are so small that fluctuations of the optical output are small even if the longitudinal modes jump. In consequence, the first kink ($a_1$) ceases to be generated in the current-optical output characteristic.

In order to obtain more stabilized the longitudinal multi-oscillation mode, the volume of the active layer that is formed of the quantum well structure should preferably be reduced. More specifically, it is advisable to use one or two quantum well structures to form the active layer.

If the volume of the active layer is reduced, the value βsp in expression (1) becomes greater, so that single longitudinal mode oscillation is restrained. If the active layer volume is lessened, moreover, the internal loss of the cavity is reduced, so that the optical output can be improved.

If the cavity length (L) is 1.200 µm or more, furthermore, the volume resistance of the cavity is lowered. If the injected current is increased, therefore, the temperature of the active layer is restrained from rising, so that the laser beam no longer can be moved. In consequence, dislocation of transverse oscillation modes (beam steering), which occurs with conventional devices, never takes place, so that the second kink ($a_2$) cannot be generated in the current-optical output characteristic.

Thus, in the case of the device according to the present invention, the cavity length (L) is adjusted to 1,200 µm (or more), so that the kinks $a_1$ and $a_2$ cannot be generated in the current-optical output characteristic curve, and therefore, the linearity of the curve can be maintained.

Since the increase of the cavity length (L) results in a reduction of the quantum efficiency, however, a low-reflection film should preferably be formed on one end face (front facet) of the cavity in the device of the invention.

More specifically, a low-reflection film with a reflectance of 5% or less is formed on the one end face of the cavity, and a high-reflection film with a reflectance of 80% or more on the other end face.

EXAMPLE

1. Manufacture of Device

A lower clad layer 2 of n-AlGaAs with a thickness of 2 µm, an active layer 3 formed of two quantum well structures of InGaAs and GaAs, an upper clad layer 4 of p-AlGaAs with a thickness of 2 µm, and a cap layer 5 of p-GaAs with a thickness of 0.3 µm were successively stacked in layers on the (100) surface of an n-GaAs substrate 1 by the MOCVD method. Thereafter, the upper part of the resulting layer structure was formed into a mesa structure 4 µm wide and 2 µm high, and its whole surface was coated with a passivation film 6 of SiN. The back surface of the substrate 1 was polished so that the overall thickness of the substrate was about 100 µm. After that portion of the passivation film 6 which was situated on the upper surface of the cap layer 5 was removed, an upper electrode 7 of Ti/Pt/Au was formed on the surface of the resulting structure, and a lower electrode 8 of AuGe/Ni/Au was formed on the back surface of the substrate 1.

InP- and GaInNAs-based semiconductor materials may be used in place of the aforesaid materials for the device A.

After the substrate was then cleft into a bar with a different cavity length (L), a low-reflection film 9 of SiN was formed on one end face $S_1$ of the bar, and a high-reflection film 10 of $SiO_2$/Si was formed on the other end face $S_2$. Finally, the bar was worked into chips, whereupon devices, such as the one shown in FIG. 1, were obtained.

2. Characteristics of Device

For the devices obtained in this manner, injected currents (hereinafter referred to as kink currents) with which kinks are generated were measured.

In consideration of the practicality of the device for use as a pumping light source, the "kink" is defined herein as a state in which the external differential quantum efficiency varies by 15% or more relative to the initial external differential quantum efficiency that the device shows when injected current just exceeds the threshold current.

Figure 6:
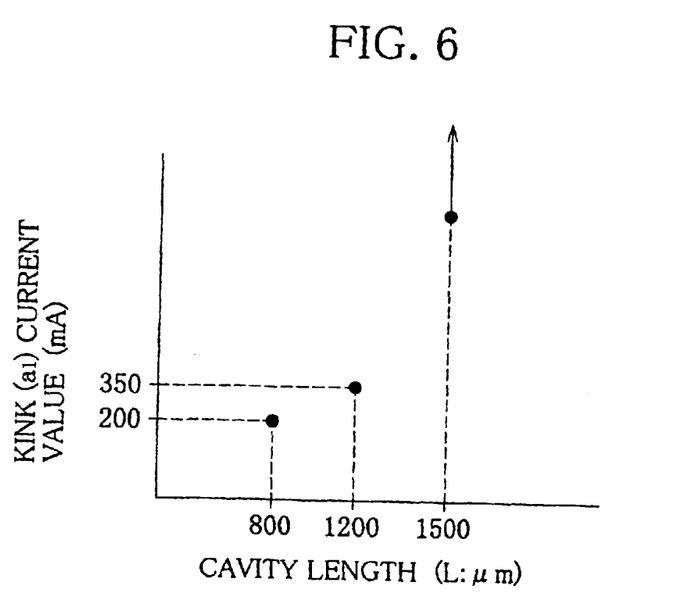
FIG. 6 is a graph showing the relation between the cavity length (L) of the device and the current value for the generation of a kink ($a_1$)

FIG. 6 shows the results of measurement on the kink ($a_1$) that is attributable to jumping of longitudinal modes.

As seen from FIG. 6, the kink ($a_1$) current value of a device having the cavity length (L) of 800 µm is 200 mA, and that of a device having the cavity length (L) of 1,200 µm is 350 mA. In the case of a device having the cavity length (L) of 1,500 µm, however, currents not higher than 700 mA do not cause generation of the kink ($a_1$).

Figure 7:
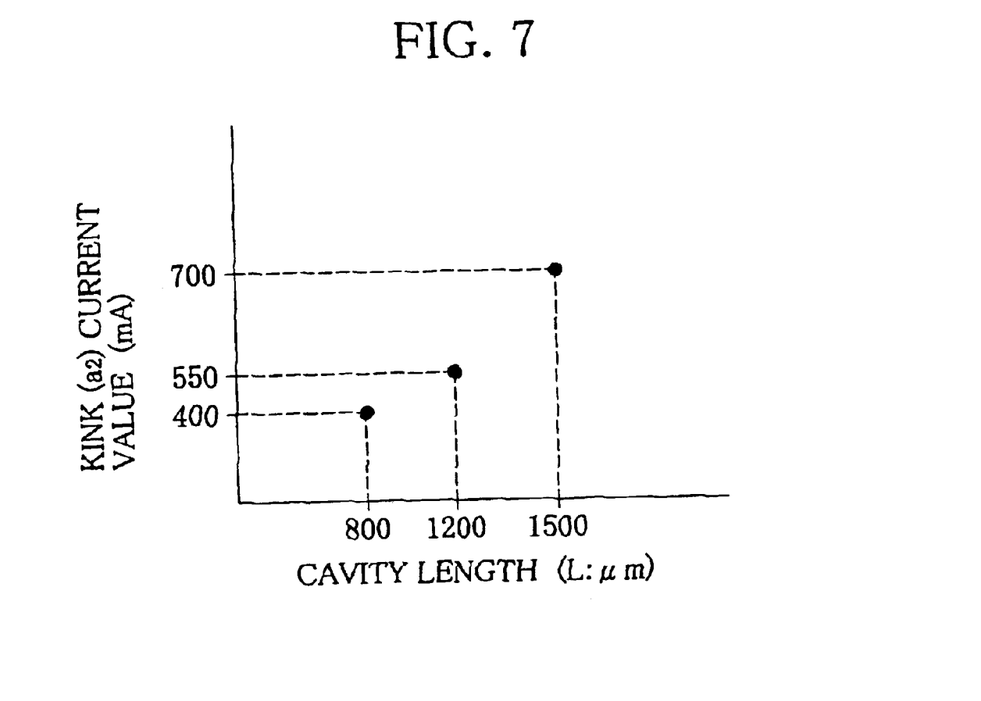
FIG. 7 is a graph showing the relation between the cavity length (L) of the device and the current value for the generation of a kink ($a_2$)

FIG. 7 shows the results of measurement on the kink ($a_1$) that is attributable to beam steering for the time of high current injection.

As seen from FIG. 7, the kink ($a_1$) current value of the device having the cavity length (L) of 800 µm is 400 mA, that of the device having the cavity length (L) of 1,200 µm is 550 mA, and that of the device having the cavity length (L) of 1,500 µm is 700 mA. Thus, the greater the cavity length (L), the higher the current value that causes beam steering is.

This proves that if the cavity length (L) is longer, resistance heat attributable to the injected current is reduced correspondingly, so that the rise in temperature of the active layer can be restrained to ensure a satisfactory transverse light confinement effect by occurring no displacement of the transverse mode field.

In the case where the injected current is at 400 mA, operating voltages for the devices with the cavity lengths of 800 μm, 1,200 μm, and 1,500 μm are 2.1 V, 1.9 V, and 1.75 V, respectively. Thus, the greater the cavity length (L), the lower the operating voltage is.

Figure 8:
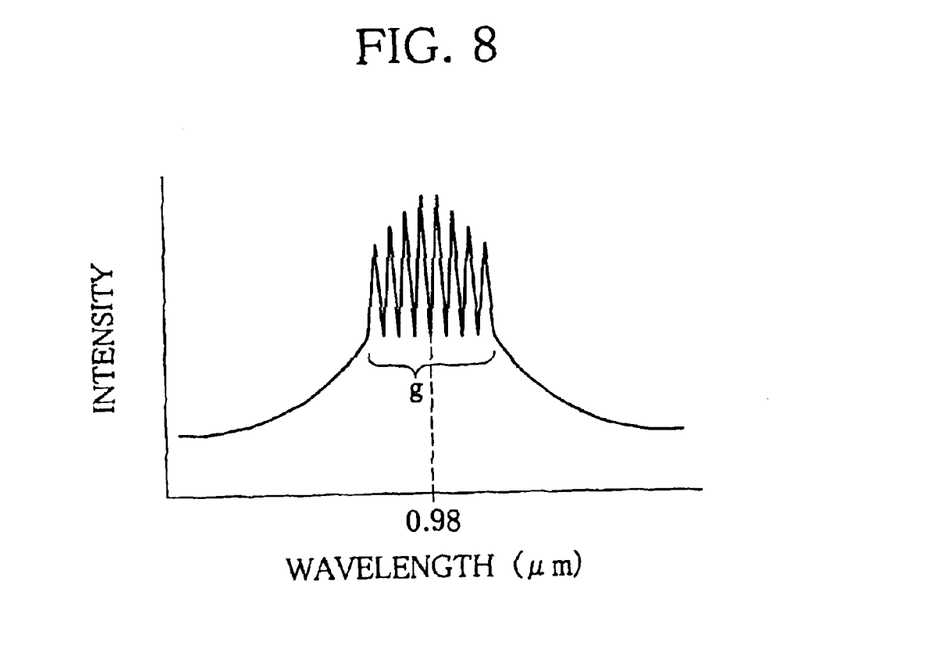
FIG. 8 shows an oscillation spectrum of a device according to the invention with the cavity length of 1.500 μm.

FIG. 8 shows an oscillation spectrum of the device with the cavity length (L) of 1,500 μm for the case where the injected current is at 200 mA.

As seen from FIG. 8, this device is based on a longitudinal multi-oscillation mode in which a large number of longitudinal modes exist at short intervals in a gain band g. The interval between each two adjacent longitudinal modes is about 0.1 nm spacing.

Figure 9:
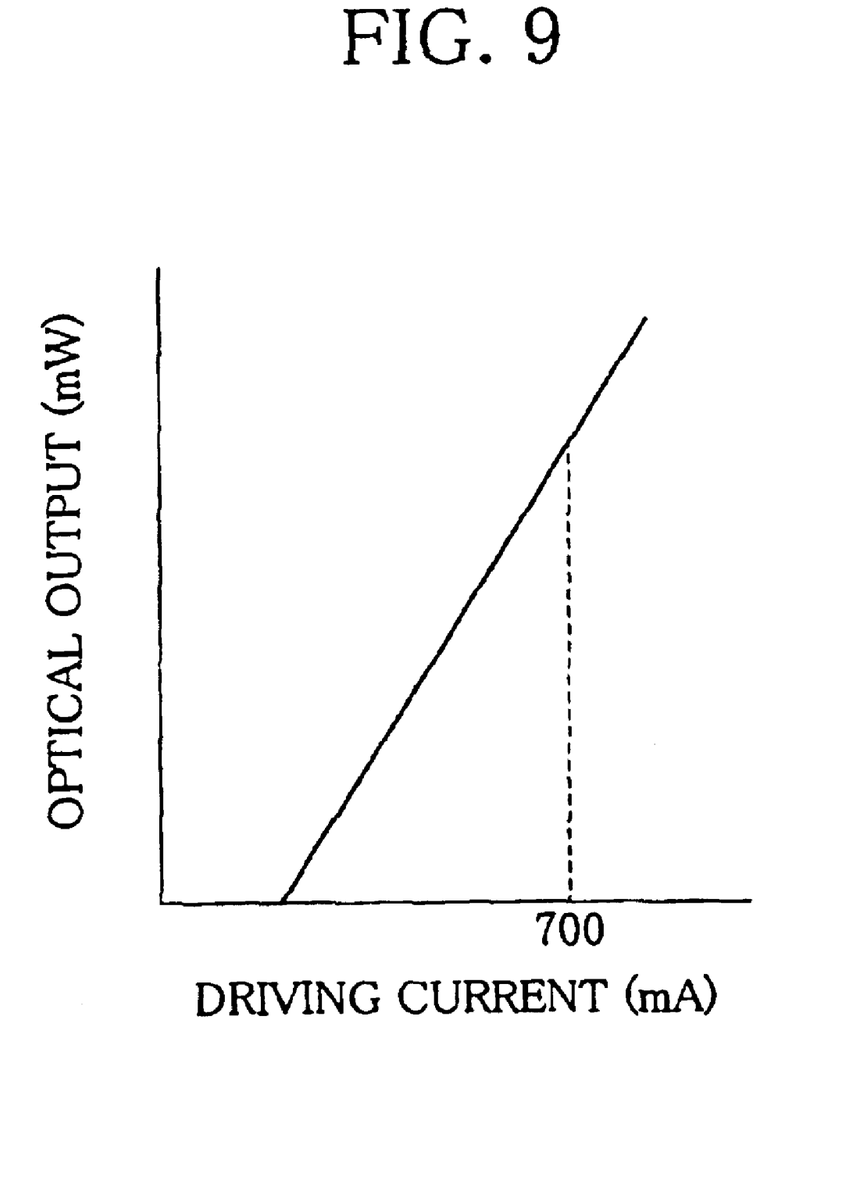
FIG. 9 shows a current-optical output characteristic curve for the device of the invention with the cavity length of 1,500 μm.

FIG. 9 shows a current-optical output characteristic curve for this device.

In the case of this device, as seen from FIG. 9, injected currents not higher than 700 mA cause generation of no kinks, and the linearity of the current-optical output characteristic is maintained.

As is evident from the above description, the semiconductor laser device of the gain-waveguide type according to the present invention undergoes longitudinal multi-mode oscillation. In the module that is formed by connecting the device to the optical fiber, therefore, a bad influence of the return light can be restrained, and there is no possibility of dislocation of transverse modes (beam steering) in a far field pattern, so that fluctuations of the fetched optical output can be inhibited. In consequence, the linearity of the current-optical output characteristic can be maintained as a whole even if the injected current is increased.

Thus, the device according to the present invention, for use as a pumping light source for optical fiber amplifier, is of great industrial value.

What is claimed is:

1. A semiconductor laser device comprising:
   a resonator cavity having a first end face and a second end face, and comprising a cavity portion between the first and second end faces, the cavity portion having a length greater than 1200 μm and a width along the entire length that can only support a single transverse mode;
   a laminated structure of semiconductor material formed on a substrate and including a lower cladding layer, an active layer disposed over the lower cladding layer, and an upper cladding layer disposed over the active layer, the active layer comprising at least one quantum well structure, the upper cladding layer having a mesa stripe that is oriented along the cavity length, the top of the mesa stripe being configured to receive current applied to the laser device, said resonator cavity comprising at least a portion of said laminated structure;
   at least one cover layer disposed over at least one portion of the upper cladding layer and adjacent to the mesa stripe;
   a low-reflection film formed having a reflectance of 5% or less on one end face of the structure; and
   a high-reflection film having a reflectance of 80% or more formed on the other end face of the structure; and
   wherein the semiconductor laser device has intervals between adjacent longitudinal oscillation modes, at least one of the intervals being equal to or less than 0.12 nm.

2. The semiconductor laser device according to claim 1, wherein said device has a transverse light confinement structure with the transverse refractive index difference of about $1 \times 10^{-2}$ for oscillation modes.

3. The semiconductor laser device according to claim 1, wherein the reflectance of said low-reflection film on the one end face is 5% or less.

4. The semiconductor laser device according to claim 1, wherein said active layer is formed of one or two quantum well structures.

5. The semiconductor laser device according to claim 1 wherein the coefficient of light confinement to the active layer ranges from 1% to 2%.

6. The semiconductor laser device according to claim 2, wherein the coefficient of light confinement to the active layer ranges from 1% to 2%.

7. The semiconductor laser device according to claim 3, wherein the coefficient of light confinement to the active layer ranges from 1% to 2%.

8. The semiconductor laser device according to claim 4, wherein the coefficient of light confinement to the active layer ranges from 1% to 2%.

9. The semiconductor pumping laser device of claim 1, wherein said device emits light in the 0.98 μm wavelength-band.

10. The semiconductor pumping laser device of claim 9, wherein the output light of the laser is free of kinks for driving currents up to at least 350 mA, where a kink is a variation of 15% or more in the external differential quantum efficiency of the laser relative to the initial value present when the injected current just exceeds the threshold current.

11. The semiconductor pumping laser device of claim 9, wherein the output light of the laser is free of kinks for driving currents up to at least 700 mA, where a kink is a variation of 15% or more in the external differential quantum efficiency of the laser relative to the initial value present when the injected current just exceeds the threshold current.

12. The semiconductor pumping laser device of claim 9, wherein said active layer has no more than two quantum wells, wherein said substrate comprises gallium arsenide, and wherein said laminated structure includes at least gallium and arsenic.

13. The semiconductor laser device according to claim 9, wherein said device has a transverse light confinement structure with the transverse reflective index difference of about $1 \times 10^{-2}$ for oscillation modes.

14. The semiconductor laser device according to claim 9, wherein the coefficient of light confinement to the active layer ranges from 1% to 2%.

15. The semiconductor pumping laser device of claim 1, wherein the light output of the laser device is coupled to a optic fiber such that light from an optical fiber is fed back to the laser device.

16. The semiconductor pumping laser device of claim 1, wherein said active layer has no more than two quantum wells, wherein said substrate comprises gallium arsenide, and wherein said laminated structure includes at least gallium and arsenic.

17. The semiconductor pumping laser device of claim 16, wherein said laminated structure further include at least indium and nitrogen.

18. The semiconductor pumping laser device of claim 16, wherein the output light of the laser is free of kinks for driving currents up to at least 350 mA, where a kink is a variation of 15% or more in the external differential quantum efficiency of the laser relative to the initial value present when the injected current just exceeds the threshold current.

19. The semiconductor pumping laser device of claim 16, wherein the output light of the laser is free of kinks for driving currents up to at least 700 mA, where a kink is a variation of 15% or more in the external differential quantum efficiency of the laser relative to the initial value present when the injected current just exceeds the threshold current.

20. The semiconductor pumping laser device of claim 16, wherein the light output of the laser device is coupled to a optic fiber such that light from an optical fiber is fed back to the laser device.

21. The semiconductor laser device according to claim 16, wherein said device has a transverse light confinement structure with the transverse reflective index difference of about $1 \times 10^{-2}$ for oscillation modes.

22. The semiconductor laser device according to claim 16, wherein the coefficient of light confinement to the active layer ranges from 1% to 2%.

23. The semiconductor pumping laser device of claim 1, wherein the output light of the laser is free of kinks for driving currents up to at least 350 mA, where a kink is a variation of 15% or more in the external differential quantum efficiency of the laser relative to the initial value present when the injected current just exceeds the threshold current.

24. The semiconductor pumping laser device of claim 23, wherein the output light of the laser is free of kinks for driving currents up to at least 700 mA, where a kink is a variation of 15% or more in the external differential quantum efficiency of the laser relative to the initial value present when the injected current just exceeds the threshold current.

25. The semiconductor pumping laser device of claim 23, wherein the light output of the laser device is coupled to a optic fiber such that light from an optical fiber is fed back to the laser device.

26. The semiconductor laser device according to claim 23, wherein said device has a transverse light confinement structure with the transverse reflective index difference of about $1 \times 10^{-2}$ for oscillation modes.

27. The semiconductor laser device according to claim 23, wherein said active layer comprises no more than two quantum well structures.

28. The semiconductor laser device according to claim 23, wherein the coefficient of light confinement to the active layer ranges from 1% to 2%.

29. A semiconductor laser device comprising:
    a resonator cavity having a first end face and a second end face, and comprising a cavity portion between the first and second end faces, the cavity portion having a length greater than 1200 μm and a width at each point along the length of the cavity portion that can only support a single transverse mode;
    a laminated structure of semiconductor material formed on a substrate and including a lower cladding layer, an active layer disposed over the lower cladding layer, and an upper cladding layer disposed over the active layer, the active layer comprising at least one quantum well structure, the upper cladding layer having a mesa stripe that is oriented along the cavity length, the top of the mesa stripe being configured to receive current applied to the laser device, said resonator cavity comprising at least a portion of said laminated structure;
    at least one cover layer disposed over at least one portion of the upper cladding layer and adjacent to the mesa stripe;
    a low-reflection film formed having a reflectance of 5% or less on one end face of the structure; and
    a high-reflection film having a reflectance of 80% or more formed on the other end face of the structure; and
    wherein the semiconductor laser device has intervals between adjacent longitudinal oscillation modes, at least one of the intervals being equal to or less than 0.12 nm.

30. The semiconductor laser device of claim 1 wherein the at least one cover layer comprises a dielectric material.

* * * * *